United States Patent
Eriksson

(12) 
(10) Patent No.: US 6,333,679 B1
(45) Date of Patent: Dec. 25, 2001

(54) PHASE LOCKED LOOP ARRANGEMENT IN WHICH VCO FREQUENCY IS A FRACTION OF REFERENCE FREQUENCY

(75) Inventor: Robert Eriksson, Mölndal (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/590,374

(22) Filed: Jun. 9, 2000

(30) Foreign Application Priority Data

Jun. 11, 1999 (SE) .................................... 9902210

(51) Int. Cl.[7] ............................. H03L 7/085; H03L 7/091
(52) U.S. Cl. .................................... 331/25; 327/7; 327/9; 331/27
(58) Field of Search ........................... 331/25, 27; 327/7, 327/9

(56) References Cited

U.S. PATENT DOCUMENTS

| | | | |
|---|---|---|---|
| 4,484,153 | 11/1984 | Borras et al. | 331/10 |
| 5,254,955 | 10/1993 | Saeki et al. | 331/17 |
| 5,343,168 | * 8/1994 | Guthrie | 331/16 |
| 5,451,910 | 9/1995 | Guthrie | 331/16 |
| 6,005,443 | * 12/1999 | Damgaard et al. | 331/25 |

* cited by examiner

*Primary Examiner*—Siegfried H. Grimm
(74) *Attorney, Agent, or Firm*—Burns, Doane, Swecker & Mathis, L.L.P.

(57) ABSTRACT

In a phase locked loop arrangement of a frequency synthesiser, a signal outputted from a voltage controlled oscillator is locked to a reference oscillator. A phase detector is arranged so that the frequency of the reference oscillator is a multiple of the frequency of the voltage controlled oscillator, which significantly reduces the phase noise emitted by the voltage controlled oscillator.

9 Claims, 3 Drawing Sheets

PHASE LOCKED LOOP ARRANGEMENT IN WHICH VCO FREQUENCY IS A FRACTION OF REFERENCE FREQUENCY

This application claims priority under 35 U.S.C. §§119 and/or 365 to 9902210-5 filed in Sweden on Jun. 11, 1999; the entire content of which is hereby incorporated by reference.

TECHNICAL FIELD OF THE INVENTION

The present invention relates generally to a phase locked loop arrangement and a variable frequency synthesiser including such an arrangement. The invention furthermore relates to an arrangement for regulating a voltage controlled oscillator in a frequency synthesiser.

DESCRIPTION OF RELATED ART

Frequency synthesisers are used for producing signals with well defined frequencies. They appear in numerous applications in telecommunication systems and elsewhere. An example of such an application in a telecommunications system is when a variable frequency synthesiser is used as a local oscillator in a radio receiver.

A frequently used way to arrange such a synthesiser is to use a voltage controlled oscillator, VCO, which is regulated to output a signal with a frequency that is a multiple of the frequency of a signal outputted from a reference oscillator.

The VCO is then normally arranged in a so called phase locked loop, PLL, where the output from the VCO is fed via a frequency divider to an input of a phase detector. The output from a reference oscillator is fed to another input of the phase detector, the resulting output of which is depending upon the phase relationship between the inputted signals. The error signal thus outputted from the phase detector is then preferably fed via a loop filter and a summing unit to the control input of the VCO. The summing unit adds a DC voltage to the filtered signal from the phase detector and serves to coarsely tune the VCO.

In this manner the VCO can lock to the signal of the reference oscillator and will output a signal having a frequency that is a multiple of the reference frequency.

Frequency synthesisers as the above described are relatively simple and robust and are therefore widely spread in many applications. A problem often encountered with such PLL circuits is the extensive phase noise of the output signal.

Ideally the signal outputted from the reference oscillator would be a sine wave with constant frequency and phase, i.e. $v(t)=V_0 \cdot \sin(\omega t+\psi)$, where $\omega$ and $\psi$ are constants. In the frequency domain this corresponds to a distinct spectral line at the frequency $\omega/2\pi$. In reality, however, the signal must be modelled with a certain amount of phase noise, i.e. $v(t)=V_0 \cdot \sin(\omega t+\psi(t))$, where the phase of the signal varies over time. In the frequency domain this corresponds to that the spectral line widens as it contains energy offset from the desired carrier frequency.

When a reference oscillator is utilised in the usual PLL circuit and the output frequency of the VCO is a multiple N of the frequency of the reference oscillator, the phase noise of the output signal will be m dB higher than the phase noise of the reference oscillator, where $m=20 \cdot \log(N)$. Therefore, for instance, if the multiple is N=8 the phase noise will be around 18 dB higher at the output of the VCO, than at the output of the reference oscillator. The multiplicating function, thus, aggravates the phase noise introduced into the PLL by the reference oscillator.

Some attempts aiming to remedy the problem with phase noise are known in the art. One such technique is described in U.S. Pat. No. 5,451,910, which is hereby incorporated by reference. Then a phase-locked loop is provided with a feedback network having an offset circuitry providing a signal with a frequency offset from the frequency of the signal outputted from a VCO. The feedback circuit further comprises a sampling mixer with an auxiliary reference frequency oscillator. The sampling mixer accomplishes a comb frequency spectrum from the offset signal. A filter extracts a particular frequency from the spectrum to the phase detector. This serves to divide the frequency of the signal outputted from the VCO that is fed to the phase detector without adding extra phase noise. It requires, however, that a phase offset circuitry, a number of mixers and an extra reference oscillator is introduced which adds complexity to the arrangement. It should also be noted that this technique does not address the problem with phase noise resulting from the fact that the reference oscillator frequency is being multiplied.

SUMMARY OF THE INVENTION

An object of the present invention is to provide a phase locked loop arrangement, for a variable frequency synthesiser, with improved phase noise characteristics.

Another object of the invention is to provide a high precision variable frequency synthesiser that is simple and inexpensive to build.

Yet another object of the invention is to provide a high precision variable frequency with improved flexibility.

According to a first aspect of the invention the above mentioned object are fulfilled in a PLL arrangement where a VCO delivers an output signal with a predetermined relationship to the signal emitted by a reference oscillator. A phase detecting means receives an output signal from the VCO and an output signal from the reference oscillator. The frequency of the signal outputted from the reference oscillator is a multiple N of the frequency of the signal outputted from the VCO. N is then an integer greater than 1. This is instead of the conventional way where the VCO delivers a frequency which is a multiple of the frequency of the reference oscillator.

This results in a simple PLL arrangement with considerably improved phase noise characteristics. When the frequency of the VCO output signal is N times lower than the frequency of the reference oscillator, the phase noise of the output signal is m dB lower than the phase noise of the reference oscillator, where $m=20 \cdot \log(N)$.

Another advantage with this arrangement is that it allows the output frequency to be more arbitrarily chosen with regard to a given reference frequency. A frequency synthesiser of the known art involves a divider circuit which in most cases divides the frequency $2^k$ times, where k is an integer. This normally restricts the freedom to chose the factor of multiplication. In the arrangement according to the invention the frequency of the reference oscillator may be divided by any integer, up to a certain fraction of the reference frequency.

In a preferred embodiment the phase detecting means is devised as a sample and hold circuit. A voltage level is produced, during a cycle of the signal received from the VCO, at the output of the phase detecting means that is depending on the voltage level of the signal received from the reference oscillator at a time when the signal of the VCO begins a cycle, i.e. the VCO samples the reference oscillator. This results in a simple arrangement that may change frequency by controlling a single DC voltage.

In another preferred embodiment the phase detecting means includes a frequency multiplier, adjusting the frequency of the signal received from the VCO and a mixer, multiplying the signal thus adjusted with the signal received from the reference oscillator. This results in an inexpensive arrangement that may be realised by means of standard multiplier components and which allows a high division of the reference frequency.

In yet another preferred embodiment the phase detecting means includes a comb unit, producing harmonics of the signal received from the VCO, a variable bandpass filter filtering the signal produced in the comb unit and a mixer multiplying the signal outputted from the variable bandpass filter with the signal received from the reference oscillator. This results in flexible circuit that may change frequency by controlling a single DC voltage.

According to another aspect of the invention the above mentioned objects are fulfilled by means of an arrangement for controlling a VCO in a phase locked loop in a frequency synthesiser. The arrangement comprises a phase detecting means delivering an output signal with a magnitude depending on the phase relationship between the signal outputted from the VCO and a signal outputted from a reference oscillator. The arrangement further comprises filter means for filtering the output from the phase detecting means and a summing unit delivering a sum of the output from the filtering means and a coarse tune voltage to the voltage controlled oscillator. The phase detecting means is devised so that the frequency of the signal outputted from the voltage controlled oscillator is a fraction of the frequency of the signal outputted from the reference oscillator. This results in a simple PLL arrangement with considerably improved phase noise characteristics.

In a preferred embodiment a low noise cavity oscillator is used as reference oscillator. This results in a PLL arrangement with even more improved phase noise characteristics.

DESCRIPTION OF PREFERRED EMBODIMENTS

Figure 1A:
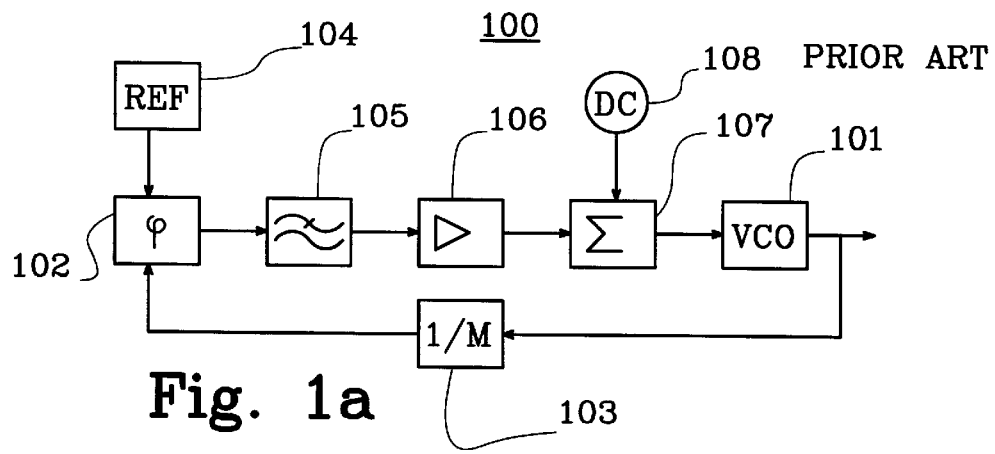
FIG. 1a illustrates a frequency synthesiser devised as a phase locked loop in accordance with known art.

FIG. 1a illustrates a phase locked loop, PLL 100 in accordance with known art. The PLL constitutes a frequency synthesiser. The PLL involves a voltage controlled oscillator, VCO 101 which delivers a signal that forms the output of the PLL. The frequency of the output signal is regulated with a DC voltage that is applied at a control input of the VCO 101. This DC voltage is accomplished by means of a feedback network 102–108, which is now given a more detailed description.

The output signal of the VCO is fed back to a phase detector 102 via a divider circuit 103, reducing the frequency f of the outputted signal to a predetermined fraction f/M. The phase detector 102 compares the phase of the signal from the divider circuit 103 with the phase of a signal delivered from a reference oscillator 104 and outputs an error signal with a magnitude depending on the relative phase relationship of the signals applied. The signals need not have the same frequency in a locked state, it suffices if frequency of the VCO is a multiple of the frequency of the reference oscillator.

The error signal outputted from the phase detector is led to a loop filter 105, defining the loop bandwidth of the PLL. The signal thus filtered is coupled to an amplifier 106. The loop bandwidth together with the properties of the amplifier determines the stability of the PLL as well as lock-in and frequency change characteristics, in accordance with control theory well known to the person skilled in the art. The amplified error signal is coupled to a summing unit 107, which adds a coarse tune DC voltage 108 and outputs the sum as a control signal to the control input of the VCO 101.

In normal operation, when a frequency synthesiser as the above described is started the coarse tune DC voltage 108 is applied to the VCO 101, which transmits a signal with a certain frequency. If the error signal then outputted by the phase detector 102 is within the bandwidth of the loop filter 105 the VCO 101 will lock to the reference oscillator 104. Thus, a signal is transmitted by the VCO 101 with a frequency that is a factor N higher than the frequency of the signal outputted from the reference oscillator 104. N is an integer determined by the counting cycle of the frequency divider circuit 103 and the added coarse tune voltage 108.

Figure 1B:
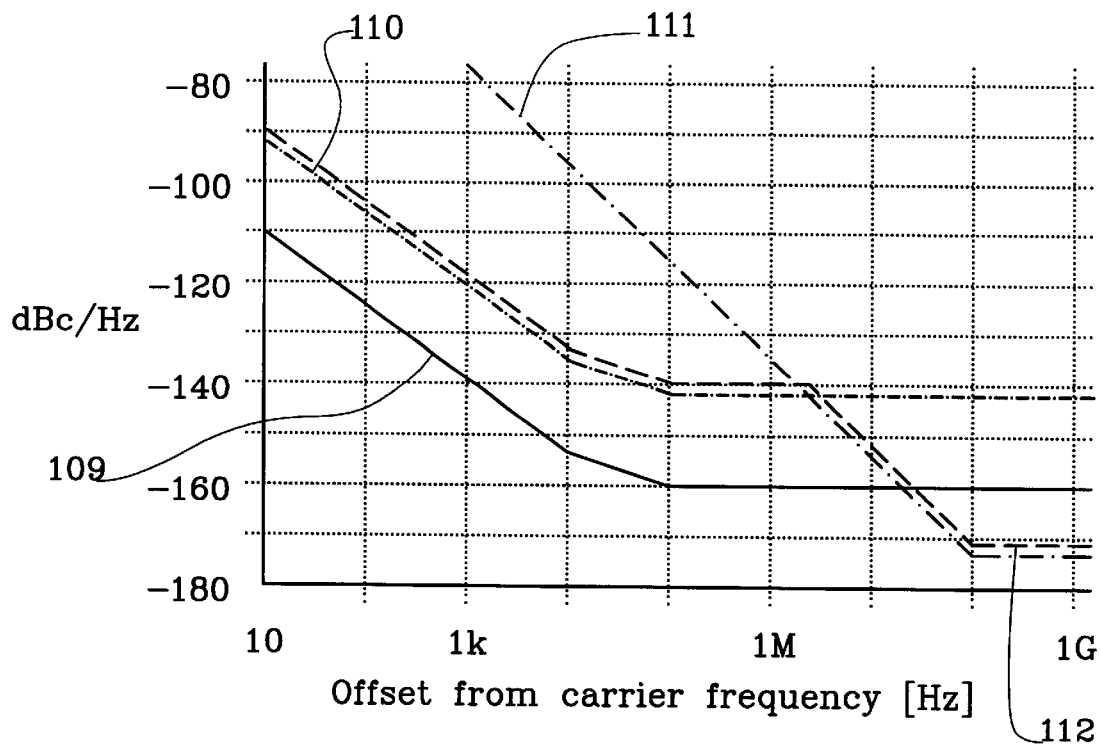
FIG. 1b shows typical phase noise characteristics of such a phase locked loop.

FIG. 1b shows a typical phase noise characteristics of a phase locked loop as described above. Depicted is the spectral energy distribution in a sideband offset from a carrier wave, i.e. the right half of a spectral line. The x-axis represents the offset from the carrier frequency. The y-axis represents the spectral density in relation to the spectral energy of the total signal. Thus, −100 dBc/Hz at a certain offset frequency means that the spectral power within 1 Hz bandwidth at this offset frequency is 100 dB lower than the total power of the spectral line.

A first graph 109 then shows the phase noise characteristics of the reference oscillator 104. Since the frequency of the reference oscillator is multiplied by a factor N the phase noise at the output of the VCO is m dB higher, where m=20·log(N). In the case depicted, the frequency is multiplied by 8, and therefore the multiplied phase noise characteristics lies roughly 18 dB higher than the phase noise of the reference oscillator as shown in a second graph 110. A third graph 111 of the diagram shows the phase noise characteristics of a free running VCO. This corresponds to a case where the feedback loop is not locked and the VCO is regulated only by the coarse tune DC voltage. The second and third graphs intersect a certain frequency. If the cut-off frequency of the loop filter is set to this frequency the phase noise characteristic of the overall circuit will be determined by a fourth graph 112.

It is evident from FIG. 1b that the frequency multiplicating function of a conventional PLL as depicted in FIG. 1a aggravates the phase noise introduced into the PLL by the reference oscillator 104.

Figure 2A:
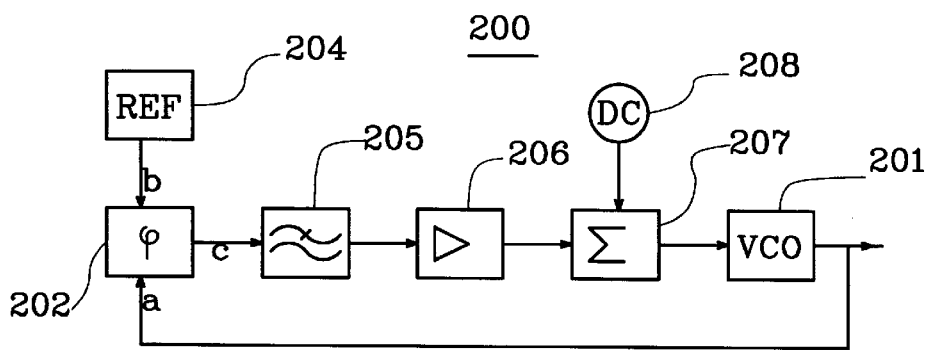
FIG. 2a illustrates a frequency synthesiser devised as a phase locked loop arrangement in accordance with the invention.

FIG. 2a illustrates a frequency synthesiser with a phase locked loop arrangement 200 in accordance with the invention. The arrangement involves a VCO 201 that is regulated by a control voltage to deliver a signal with a frequency having a predetermined, but variable relationship to the frequency delivered by a reference oscillator 204. The reference oscillator 204 forms a regulating arrangement together with a phase detecting means 202, a loop filter 205, an amplitude adjustment circuit 206, a summing unit 207 and a coarse tune DC-source 208. The phase detecting means 202 receives one input signal from the VCO 201 to a first input (a). A second input (b) receives an output signal from the reference oscillator 204. An error signal at an output (c) is transmitted via a loop filter 205, determining the loop bandwidth of the PLL 200, to an amplitude adjustment circuit 206. This circuit may in some cases be an amplifier whilst in other cases an attenuator is appropriate. As a consequence yet other cases are conceivable where the amplitude adjustment circuit 206 is entirely omitted. Generally, the loop filter 205 and the amplitude adjustment circuit 206 should be designed to obtain stability in accordance with known control theory. The loop filter also involves an integrating component. A coarse tune DC voltage 208 is added to the error signal outputted from the amplitude adjustment circuit 206 by means of a summing unit 207. The output from the summing unit 207 is used to regulate the VCO 201.

In accordance with the invention the phase detecting means 202 is so designed that the frequency outputted from the VCO 201 is equal to the frequency of the signal outputted from the reference oscillator 204 divided by an integer N that is larger than 1 Thus, the output frequency of the VCO 201 is substantially lower than the output frequency of the reference oscillator 204. As a result the phase noise in the VCO output signal is substantially reduced. How the phase detector means should be designed in order to achieve this effect will be described later. A reference oscillator 204 delivering signals with higher frequencies than the reference oscillator 104 of FIG. 1 is normally chosen.

Figure 2B:
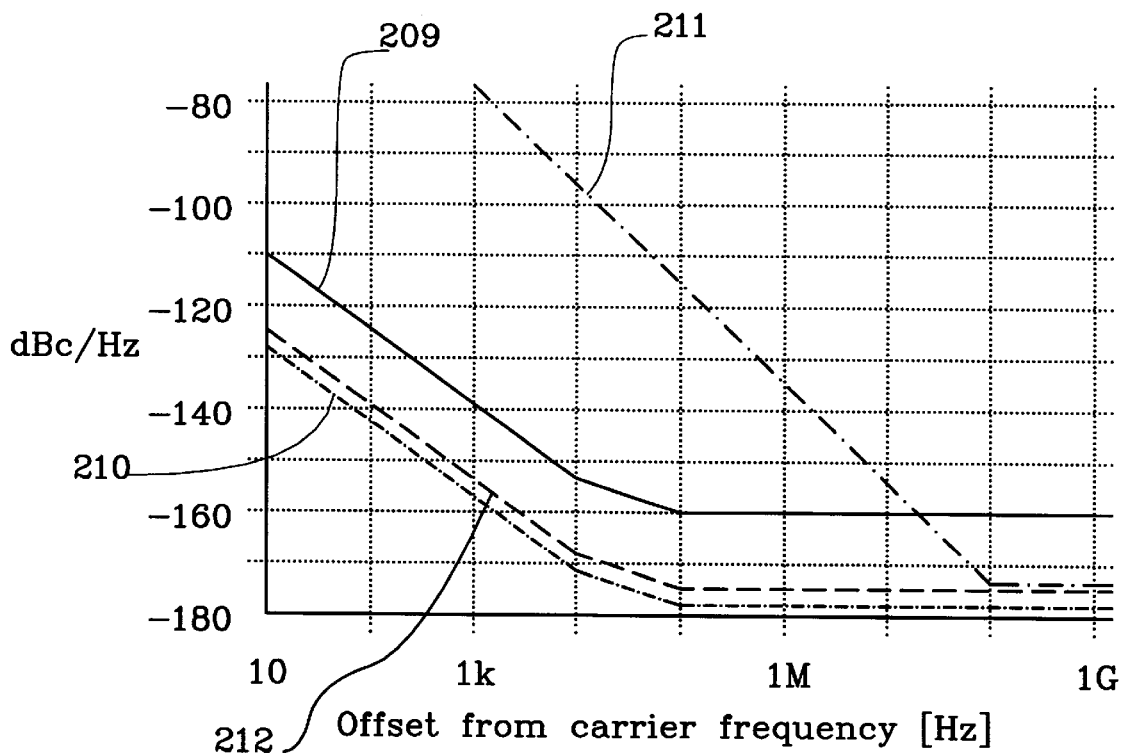
FIG. 2b shows typical phase noise characteristics of a phase locked loop in accordance with the invention.

FIG. 2b illustrates a typical phase noise characteristics of a PLL in accordance with the invention. A first graph 209 shows the noise characteristics of the reference oscillator 204. A second graph 210 shows the noise characteristics of the signal with a divided frequency.

When the frequency of the reference oscillator is divided by a divisor N, the phase noise of the output signal will be m dB lower than the phase noise of the reference oscillator, where $m=20 \cdot \log(N)$. Thus, as can be seen, the second phase noise graph is levelled around 18 dB below the phase noise of the reference source and corresponds to a division of the reference frequency by a divisor 8. A third graph 211 shows the phase noise characteristics of the free running VCO 201. As can be seen, the output phase noise, indicated by a fourth line 212 is substantially lower than in the prior art example. It should also be noted that this improvement also allows high frequency cavity resonators as reference oscillators.

Figure 3:
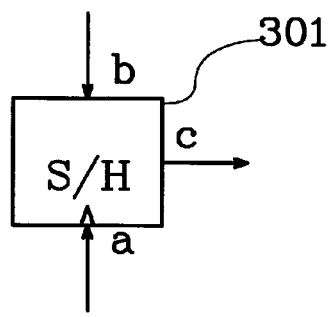
FIGS. 3–5 illustrate different embodiments of the phase detecting means depicted in FIG. 2.
Figure 4:
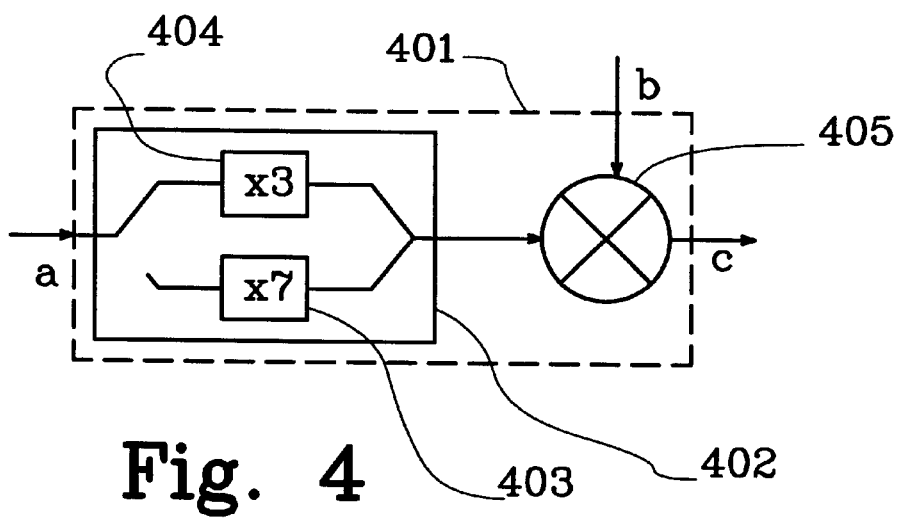
Figure 5:
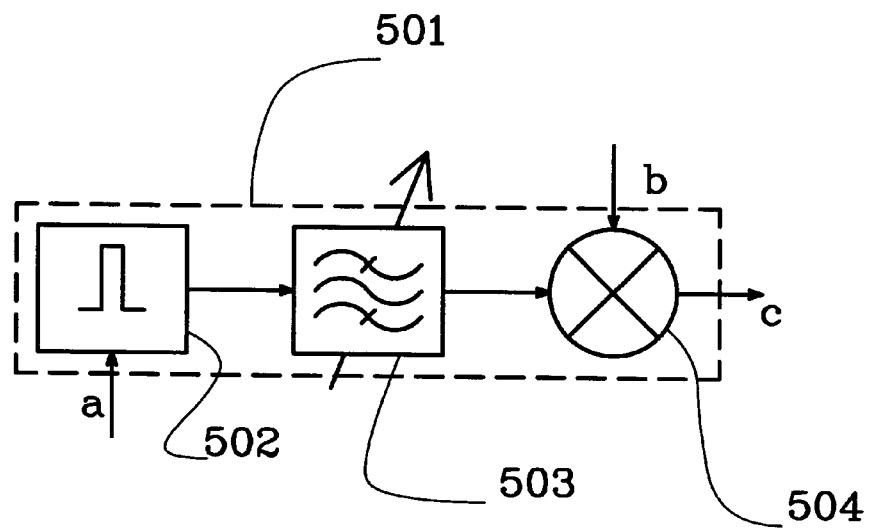

FIGS. 3–5 illustrate different embodiments of the phase detecting means depicted in FIG. 2.

A first embodiment of the phase detector means is illustrated in FIG. 3. The phase detector means is then formed by a sample and hold circuit 301. The sample and hold circuit functions in the following manner. Each time the VCO output signal inputted at input (a) reaches a certain stage in its cycle, the input voltage at input (b) is sampled and thus appears on the output (c). The output voltage is then kept constant until a new sample is retrieved. Thus, the VCO signal samples the reference signal. The state of the input signal (a) triggering the sample procedure may preferably be a zero-crossing with positive or negative direction of the voltage. A peak voltage may, however, also be used. It is of course also possible to trigger sample procedures more than one time per cycle, for instance twice a cycle at all zero crossings. Note that the signal appearing at input (a) has a lower frequency than the signal appearing at input (b). In this embodiment, the output frequency of the frequency synthesiser may be changed simply by changing the coarse tune voltage of the PLL.

A second embodiment of the phase detector means is illustrated in FIG. 4. The phase detector means 401 is then formed with a frequency multiplier circuit 402. Such a multiplier is a standard component and multiplies the frequency of the incoming signal at (a) with a certain fixed factor. The multiplier 402 may optionally be devised to provide two or more different factors by using selectable modules 403, 404, in the depicted embodiment with factors 3 and 7. The signal thus multiplied is coupled to a mixer 405. The mixer mixes the signal outputted from the reference oscillator and received at input (b) and having a frequency $f_1$ with a signal from the frequency multiplier now having a frequency $f_2$. The mixer outputs a signal containing the frequency components $f_1+f_2$ and $f_1-f_2$. The component with the frequency $f_1+f_2$ is then outside the bandwidth of the loop filter. The component with the frequency $f_1-f_2$ on the other hand is an error signal that regulates the VCO as long as it is within the loop bandwidth. This embodiment is preferred if the earlier mentioned divisor N, by which the reference frequency is divided by the PLL, is a large integer.

A third embodiment of the phase detector means 501 is illustrated in FIG. 5. The signal from the VCO received at a first input (a) is then applied to a so called comb unit 502, which accomplishes a number of harmonics to the VCO output signal. One or some of those harmonics are selected by means of a variable bandpass filter 503 and is applied to a mixer 504, which functions similarly to the mixer of the embodiment described in FIG. 4.

Although the present invention and its advantages have been described in detail, it should be understood that various changes, substitutions and alterations can be made therein without departing from the spirit and scope of the invention as defined by the appended claims.

What is claimed is:

1. A phase locked loop arrangement comprising a voltage controlled oscillator (201), delivering an output signal with a frequency having a predetermined relationship to the frequency of a signal delivered by a reference oscillator (204); and a phase detecting means (202) receiving an output signal from said voltage controlled oscillator (201) at a first input (a) and the output signal from the reference oscillator (204) at a second input (b) and outputting an error signal at an output (c) depending on the phase difference between said inputted signals for regulating said voltage controlled oscillator (201) characterised in that the frequency of the signal outputted from the voltage controlled oscillator (201) is a fraction 1/N of the frequency of the signal outputted from the reference oscillator (204), where N is an integer that is greater than 1.

2. A phase locked loop arrangement as claimed in claim 1 characterised in that said phase detecting means (202) is devised as a sample and hold circuit (301) wherein a voltage level is produced, during a cycle of the signal received at said first input (a), at the output (c) of said phase detecting means that is depending on the voltage level at said second input (b) at a time when the signal of said first input (a) begins said cycle.

3. A phase locked loop arrangement as claimed in claim 1 characterised in that said phase detecting means (202) includes a frequency multiplier (404), adjusting the frequency of the signal received at said first input (a) and a mixer (405), multiplying the signal thus adjusted with the signal received at the second input (b), and outputting a product thus accomplished at said output (c).

4. A phase locked loop arrangement as claimed in claim 1 characterised in that said phase detecting means (202) includes a comb unit (502), producing harmonics of the signal received at said first input (a), a bandpass filter (503) filtering the signal produced in the comb unit and a mixer (504) multiplying the signal outputted from said bandpass filter (503) with the signal received at said second input (b), and outputting a product thus accomplished at said output (c).

5. An arrangement for regulating a voltage controlled oscillator (201) in a phase locked loop (200) in a frequency synthesiser, said arrangement comprising a phase detecting means (202) delivering an output signal having a magnitude depending on the phase relationship between the signal outputted from said voltage controlled oscillator (201), inputted at a first input (a) and a signal outputted from a reference oscillator (204), inputted at a second input (b), filter means (205) for filtering the output signal from said phase detecting means (202), an amplifier (206) for amplifying the filtered output signal, a summer unit emitting to said voltage controlled oscillator a sum of the output from said amplifier (206) and a coarse tune voltage characterised in that said phase detecting means (202) is devised so that the frequency of the signal outputted from said voltage controlled oscillator (202) is a fraction of the frequency of the signal outputted from said reference oscillator (204).

6. An arrangement for regulating a voltage controlled oscillator (201) as claimed in claim 5 characterised in that said phase detecting means (202) is devised as a sample and hold circuit (301) and that a voltage level is produced, during a period cycle of the signal received at said first input (a), at the output (c) of said phase detecting means that is depending on the voltage level of said second input (b) at a time when the signal of said first input (a) begins said period cycle.

7. An arrangement for regulating a voltage controlled oscillator (201) as claimed in claim 5 characterised in that said phase detecting means (202) includes a frequency multiplier (402), adjusting the frequency of the signal received at said first input (a) and a mixer (405), multiplying the signal thus adjusted with the signal received at the second input (b), and outputting a product thus accomplished at said output (c).

8. An arrangement for regulating a voltage controlled oscillator as claimed in claim 5 characterised in that said phase detecting means (202) includes a comb unit (502) producing harmonics of the signal received at input (a), a bandpass filter (503) filtering the signal produced in the comb (502) unit and a mixer (504) multiplying the signal outputted from said bandpass filter (503) with the signal received at input (b), and outputting a product thus accomplished at said output (c).

9. An arrangement for regulating a voltage controlled oscillator (201) as claimed in claim 5 characterised in that said reference oscillator (204) is a low noise cavity oscillator.

* * * * *